US009435461B2

(12) United States Patent
Akazaki et al.

(10) Patent No.: US 9,435,461 B2
(45) Date of Patent: Sep. 6, 2016

(54) CONTROLLER OF ELECTROMAGNETIC VALVE DRIVING CIRCUIT AND ABNORMALITY DIAGNOSING METHOD FOR ELECTROMAGNETIC VALVE DRIVING CIRCUIT

(71) Applicant: AISIN AW CO., LTD., Anjo-shi, Aichi-ken (JP)

(72) Inventors: Kenta Akazaki, Anjo (JP); Moritaka Fukuda, Anjo (JP); Kohei Kondo, Anjo (JP); Kento Yamashita, Anjo (JP)

(73) Assignee: AISIN AW CO., LTD., Aichi-ken (JP)

(*) Notice: Subject to any disclaimer, the term of this patent is extended or adjusted under 35 U.S.C. 154(b) by 85 days.

(21) Appl. No.: 14/373,395

(22) PCT Filed: Feb. 22, 2013

(86) PCT No.: PCT/JP2013/054507
§ 371 (c)(1),
(2) Date: Jul. 21, 2014

(87) PCT Pub. No.: WO2013/145980
PCT Pub. Date: Oct. 3, 2013

(65) Prior Publication Data
US 2015/0014561 A1 Jan. 15, 2015

(30) Foreign Application Priority Data
Mar. 29, 2012 (JP) .................. 2012-077233

(51) Int. Cl.
| F16K 31/06 | (2006.01) |
| F16H 61/12 | (2010.01) |
| G01R 31/06 | (2006.01) |
| F16H 61/00 | (2006.01) |
| G01R 31/28 | (2006.01) |

(52) U.S. Cl.
CPC ....... F16K 31/0675 (2013.01); F16H 61/0006 (2013.01); F16H 61/12 (2013.01);
(Continued)

(58) Field of Classification Search
None
See application file for complete search history.

(56) References Cited

U.S. PATENT DOCUMENTS

| 2004/0226785 A1 | 11/2004 | Sugimura | |
| 2011/0214741 A1* | 9/2011 | Fukano | ................ H01F 7/1805 251/129.15 |

(Continued)

FOREIGN PATENT DOCUMENTS

| JP | 06-86086 U | 12/1994 |
| JP | 09-100738 A | 4/1997 |

(Continued)

OTHER PUBLICATIONS

International Search Report for PCT/JP2013/054507, dated Apr. 9, 2013 (PCT/ISA/210).

*Primary Examiner* — Jacob S Scott
(74) *Attorney, Agent, or Firm* — Sughrue Mion, PLLC

(57) ABSTRACT

A controller of an electromagnetic valve driving circuit include a switching element connected to an electromagnetic valve solenoid, a cutoff circuit for cutting off a connection between a power supply and the switching element, and a current detecting unit for detecting a current flowing in the solenoid. The controller includes an abnormality diagnosing unit for outputting a cutoff command to the cutoff circuit for cutting off the connection between the power supply and the switching element, and outputting a switching command causing the switching element to perform a switching operation when a predetermined diagnosis condition is satisfied, and determining that the cutoff circuit normally operates when the solenoid current is less than a threshold value and determining that the cutoff circuit operates abnormally when the solenoid current is greater than or equal to the threshold value while outputting the cutoff command and the switching command.

9 Claims, 6 Drawing Sheets

(52) U.S. Cl.
CPC ....... *B60Y2300/192* (2013.01); *B60Y 2300/45* (2013.01); *F16H 2312/20* (2013.01); *G01R 31/06* (2013.01); *G01R 31/2829* (2013.01)

(56) References Cited

U.S. PATENT DOCUMENTS

2011/0253919 A1* 10/2011 Imamura ............... F16H 1/0251
  251/129.15

2012/0112771 A1* 5/2012 Schliebe ................ G01R 31/06
  324/659

FOREIGN PATENT DOCUMENTS

| JP | 10-9434 A | 1/1998 |
| JP | 2004-270753 A | 9/2004 |
| JP | 2004-340273 A | 12/2004 |
| JP | 2010-070139 A | 4/2010 |
| JP | 2011-017520 A | 1/2011 |

* cited by examiner

|  | C-1 | C-2 | C-3 | B-1 | B-2 | F-1 |
|---|---|---|---|---|---|---|
| P |  |  |  |  |  |  |
| REV |  |  | ○ |  | ○ |  |
| N |  |  |  |  |  |  |
| D 1st | ○ |  |  |  | ● | ○ |
| D 2nd | ○ |  |  | ○ |  |  |
| D 3rd | ○ |  | ○ |  |  |  |
| D 4th | ○ | ○ |  |  |  |  |
| D 5th |  | ○ | ○ |  |  |  |
| D 6th |  | ○ |  | ○ |  |  |

○ : ENGAGEMENT, ● : ENGAGEMENT AT THE TIME OF ENGINE BRAKE

CONTROLLER OF ELECTROMAGNETIC VALVE DRIVING CIRCUIT AND ABNORMALITY DIAGNOSING METHOD FOR ELECTROMAGNETIC VALVE DRIVING CIRCUIT

CROSS REFERENCE TO RELATED APPLICATIONS

This application is a National Stage of International Application No. PCT/JP2013/054507, filed Feb. 22, 2013, claiming priority from Japanese Patent Application No. 2012-077233, filed Mar. 29, 2012, the contents of all of which are incorporated herein by reference in their entirety.

TECHNICAL FIELD

The present invention relates to a controller of an electromagnetic valve driving circuit and an abnormality diagnosing method.

BACKGROUND ART

In the related art, in driving a stepping motor in which three-phase solenoids are star-connected by the use of a plurality of switching means, a technique of switching an excitation pattern of the solenoids from a current excitation pattern to an excitation pattern in which the switching means turned on upstream from the phase grounded and short-circuited is turned off when one phase (solenoid) of the stepping motor is grounded and short-circuited has been proposed (for example, see Patent Document 1). In this technique, the solenoids are protected without cutting a supply of a current (by switching an excitation pattern) through the use of this process.

RELATED ART DOCUMENTS

Patent Document

Patent Document 1: Japanese Unexamined Utility Model Registration Application Publication No. 6-86086 (JP 6-86086 U)

SUMMARY OF THE INVENTION

In a controller of an electromagnetic valve driving circuit including a switching element connected to a solenoid of an electromagnetic valve and a cutoff circuit capable of cutting off a connection between a power supply and the switching element, a cutoff command for cutting off the connection between the power supply and the switching element is output to the cutoff circuit when ignition is turned off or the like. However, when an abnormality occurs in the cutoff circuit, the connection between the power supply and the switching element may not be actually cut off. Accordingly, an object of the present invention is to diagnose whether the cutoff circuit normally operates.

A main object of the present invention is to provide a controller of an electromagnetic valve driving circuit and an abnormality diagnosing method that can diagnose whether a cutoff circuit capable of cutting off a connection between a power supply and a switching element connected to a solenoid of an electromagnetic valve normally operates.

In order to achieve the above-mentioned main object, the controller of an electromagnetic valve driving circuit and the abnormality diagnosing method according to the present invention employ the following means.

According to the present invention, there is provided a controller of an electromagnetic valve driving circuit including a switching element connected to a solenoid of an electromagnetic valve, a cutoff circuit capable of cutting off a connection between a power supply and the switching element, and current detecting means for detecting a solenoid current flowing in the solenoid, including:

abnormality diagnosing means for outputting a cutoff command for cutting off the connection between the power supply and the switching element to the cutoff circuit and outputting a switching command for causing the switching element to perform a switching operation to the switching element when a predetermined diagnosis condition is satisfied, and determining that the cutoff circuit normally operates when the detected solenoid current is less than a threshold value and determining that the cutoff circuit does not normally operate when the detected solenoid current is greater than or equal to the threshold value while outputting the cutoff command and the switching command.

In the controller of an electromagnetic valve driving circuit according to the present invention, when a predetermined diagnosis condition is satisfied, the cutoff command for cutting off the connection between the power supply and the switching element is output to the cutoff circuit and the switching command for causing the switching element to perform a switching operation is output to the switching element. While outputting the cutoff command and the switching command, it is determined that the cutoff circuit normally operates when the solenoid current (current flowing in the solenoid) detected by the current detecting means is less than a threshold value and it is determined that the cutoff circuit does not normally operate when the solenoid current detected by the current detecting means is greater than or equal to the threshold value. When the cutoff circuit normally operates in response to the cutoff command, the connection between the power supply and the switching element is cut off. Accordingly, even when the switching element performs the switching operation in response to the switching command, no current flows in the solenoid. On the other hand, when the cutoff circuit does not normally operate in response to the cutoff command, the connection between the power supply and the switching element is not cut off (the connection is maintained). Accordingly, when the switching element performs the switching operation in response to the switching command, a current flows in the solenoid. Therefore, by comparing the solenoid current with a threshold value, it is possible to diagnose whether the cutoff circuit normally operates.

In the controller of an electromagnetic valve driving circuit according to the present invention, the electromagnetic valve may be an electromagnetic valve that is used to supply an operating fluid to an engagement element of a transmission, and the switching command may be a command for causing the switching element to perform a switching operation enabling a predetermined current to flow in the solenoid when the power supply and the switching element are connected to each other. In this case, the predetermined current may be a current smaller than a minimum current required for engagement of the engagement element. According to this configuration, even when the cutoff circuit does not normally operate, it is possible to prevent the engagement element from being in an engaged state. The predetermined diagnosis condition may be a condition that is satisfied when an ignition switch of a vehicle is turned off.

The controller of an electromagnetic valve driving circuit according to the present invention may further include transmission control means for outputting the switching command for causing the switching element to perform the switching operation with a target duty ratio which is obtained using a feedforward term based on a target current to flow in the solenoid and a feedback term for cancelling a difference between the target current and the detected solenoid current when forming a shift speed of the transmission, and the abnormality diagnosing means may be means for outputting the switching command for causing the switching element to perform the switching operation with a duty ratio which is obtained using only the feedforward term without using the feedback term. According to this configuration, it is possible to prevent a duty ratio of the switching element from fluctuating due to an influence of an oil pressure of a solenoid valve (for example, a fluctuation in back electromotive force (current) of the solenoid based on a fluctuation in oil pressure) and it is thus possible to prevent erroneous determination on whether the diagnosis target normally operates.

In the controller of an electromagnetic valve driving circuit according to the present invention, the abnormality diagnosing means may not determine whether the cutoff circuit normally operates when an abnormality occurs in the solenoid.

Alternatively, in the controller of an electromagnetic valve driving circuit according to the present invention, the cutoff circuit may be a circuit capable of cutting off connections between the power supply and a plurality of the switching elements connected to the solenoids of a plurality of the electromagnetic valves, the current detecting means may be means for detecting a plurality of solenoid currents flowing in the plurality of solenoids, and the abnormality diagnosing means may be means for outputting the switching command to the plurality of switching elements and determining whether the current circuit normally operates using the plurality of detected solenoid currents.

In the controller of an electromagnetic valve driving circuit according to the present invention, the cutoff circuit may be a circuit in which a plurality of cutoff portions capable of cutting off the connection between the power supply and the switching element are arranged in series, and the abnormality diagnosing means may be means for determining whether each of the plurality of cutoff portions normally operates.

In the controller of an electromagnetic valve driving circuit according to the present invention, the abnormality diagnosing means may be means for outputting the cutoff command and outputting the switching command while outputting the cutoff command.

According to the present invention, there is provided an abnormality diagnosing method of an electromagnetic valve driving circuit including a switching element connected to a solenoid of an electromagnetic valve, a cutoff circuit capable of cutting off a connection between a power supply and the switching element, and current detecting means for detecting a solenoid current flowing in the solenoid, including:

outputting a cutoff command for cutting off the connection between the power supply and the switching element to the cutoff circuit and outputting a switching command for causing the switching element to perform a switching operation to the switching element when a predetermined diagnosis condition is satisfied, and determining that the cutoff circuit normally operates when the detected solenoid current is less than a threshold value and determining that the cutoff circuit does not normally operate when the detected solenoid current is greater than or equal to the threshold value while outputting the cutoff command and the switching command.

In the abnormality diagnosing method of an electromagnetic valve driving circuit according to the present invention, when a predetermined diagnosis condition is satisfied, the cutoff command for cutting off the connection between the power supply and the switching element is output to the cutoff circuit and the switching command for causing the switching element to perform a switching operation is output to the switching element. While outputting the cutoff command and the switching command, it is determined that the cutoff circuit normally operates when the solenoid current (current flowing in the solenoid) detected by the current detecting means is less than a threshold value and it is determined that the cutoff circuit does not normally operate when the solenoid current detected by the current detecting means is greater than or equal to the threshold value. When the cutoff circuit normally operates in response to the cutoff command, the connection between the power supply and the switching element is cut off. Accordingly, even when the switching element performs the switching operation in response to the switching command, no current flows in the solenoid. On the other hand, when the cutoff circuit does not normally operate in response to the cutoff command, the connection between the power supply and the switching element is not cut off (the connection is maintained). Accordingly, when the switching element performs the switching operation in response to the switching command, a current flows in the solenoid. Therefore, by comparing the solenoid current with a threshold value, it is possible to diagnose whether the cutoff circuit normally operates.

MODES FOR CARRYING OUT THE INVENTION

A mode for carrying out the present invention will be described in conjunction with an embodiment.

Figure 1:
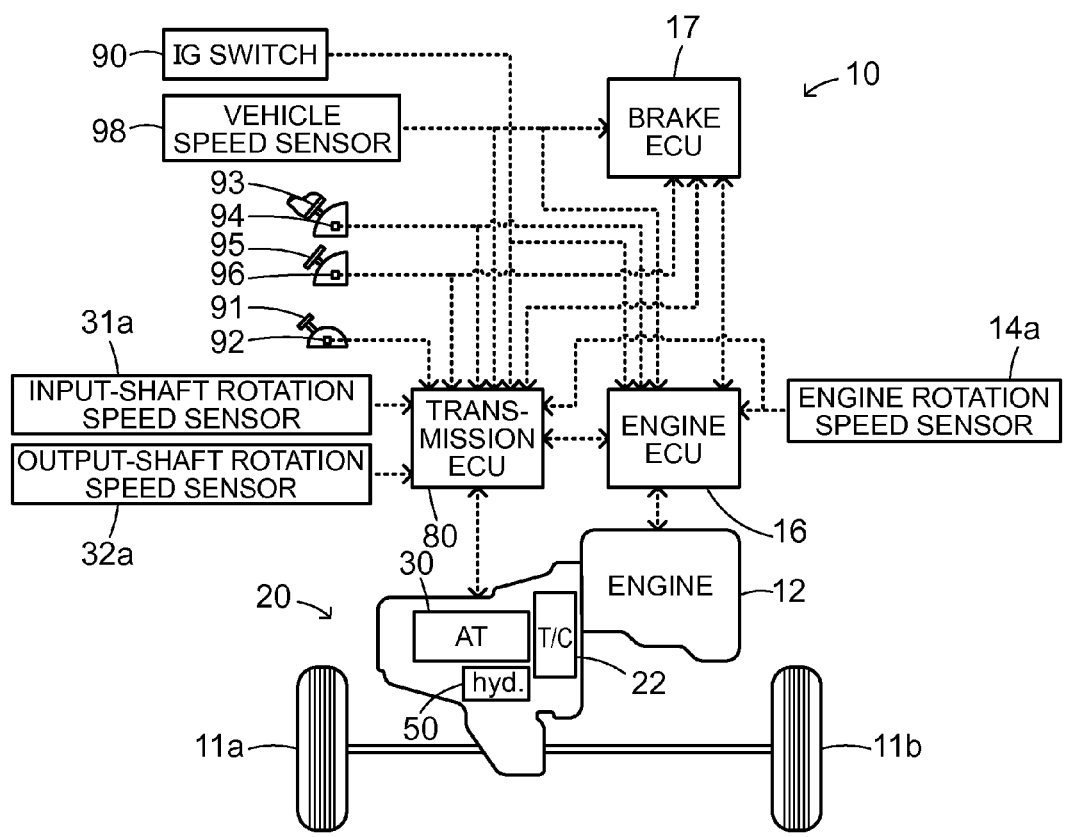
FIG. 1 is a diagram schematically illustrating a configuration of a vehicle 10 on which a controller of an electromagnetic valve driving circuit according to an embodiment of the present invention is mounted.
Figure 2:
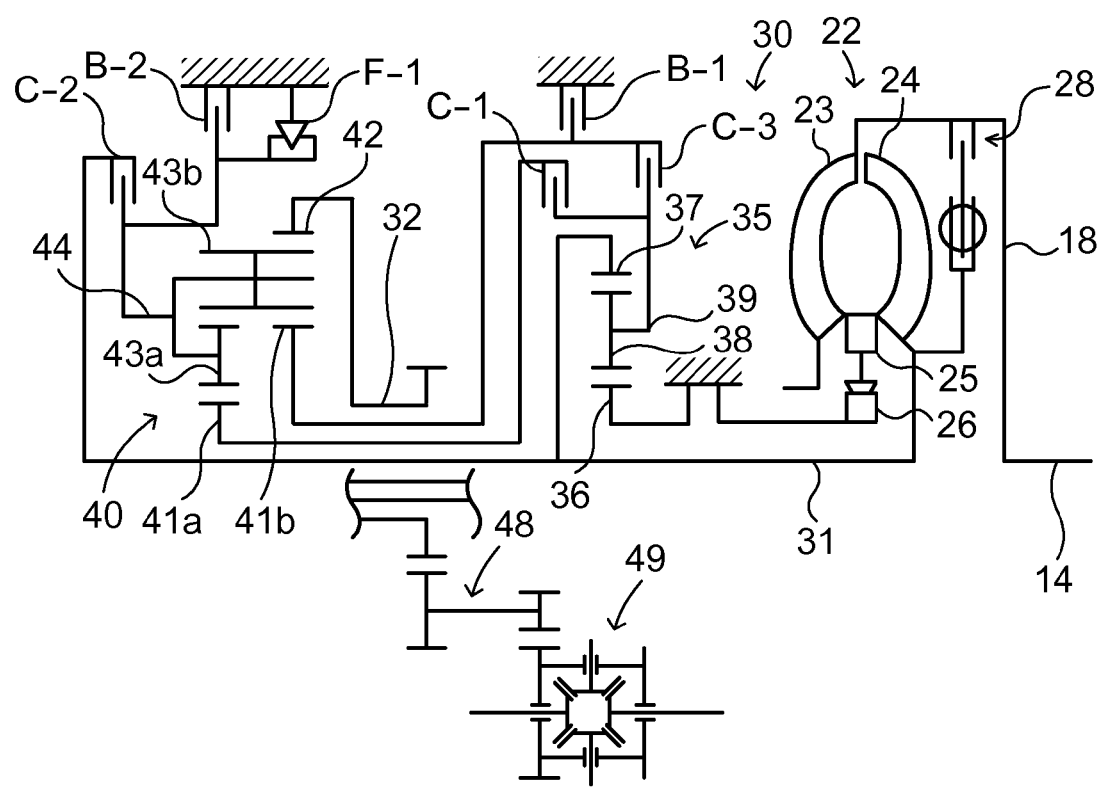
FIG. 2 is a diagram schematically illustrating configurations of a torque converter 22 and an automatic transmission 30.

FIG. 1 is a diagram schematically illustrating a configuration of a vehicle 10 on which a controller of an electromagnetic valve driving circuit according to an embodiment of the present invention is mounted and FIG. 2 is a diagram schematically illustrating configurations of a torque converter 22 and an automatic transmission 30. As illustrated in FIGS. 1 and 2, the vehicle 10 according to the embodiment includes an engine 12 serving as an internal combustion engine that outputs dynamic power by explosively combusting hydrocarbon-based fuel such as gasoline or light oil, an engine electronic control unit (hereinafter, referred to as an engine ECU) 16 that controls the operation of the engine 12, a fluid transmission apparatus 22 that is mounted on a crank shaft 14 of the engine 12, a stepped automatic transmission 30 of which an input shaft 31 is connected to the output side of the fluid transmission apparatus 22 and of which an output shaft 32 is connected to driving wheels 11a and 11b via a gear mechanism 48 or a differential gear 49 and that changes the speed of the power input to the input shaft 31 and transmits the power changed in speed to the output shaft 32, a hydraulic circuit 50 that supplies and discharges operating oil to and from the fluid transmission apparatus 22 and the automatic transmission 30, a transmission electronic control unit (hereinafter, referred to as a transmission ECU) 80 that controls the fluid transmission apparatus 22 and the automatic transmission 30 by controlling the hydraulic circuit 50, and a brake electronic control unit (hereinafter, referred to as a brake ECU) 17 that controls an electronic-control hydraulic brake unit (not illustrated).

The engine ECU 16 is constructed as a microprocessor centered on a CPU and includes a ROM that stores a process program, a RAM that temporarily stores data, an input and output port, and a communication port in addition to the CPU. Signals from various sensors that detect the operating state of the engine 12 such as an engine speed Ne from a rotation speed sensor 14a mounted on the crank shaft 14, an ignition signal from an ignition switch 90, and signals such as an accelerator operation amount Acc from an accelerator pedal position sensor 94 detecting the accelerator operation amount Acc as a depression amount on an accelerator pedal 93 and a vehicle speed V from a vehicle speed sensor 98 are input to the engine ECU 16 via an input port. A drive signal to a throttle motor driving a throttle valve, a control signal to a fuel injection valve, an ignition signal to an ignition plug, and the like are output from the engine ECU 16 via an output port.

As illustrated in FIG. 2, the fluid transmission apparatus 22 is constructed as a fluid torque converter including a lockup clutch and includes a pump impeller 23 as an input-side fluid transmission element connected to the crank shaft 14 of the engine 12 via a front cover 18, a turbine runner 24 as an output-side fluid transmission element connected to the input shaft 31 of the automatic transmission 30 via a turbine hub, a stator 25 that is disposed inside the pump impeller 23 and the turbine runner 24 and that rectifies a flow of operating oil from the turbine runner 24 to the pump impeller 23, a one-way clutch 26 that limits the rotation direction of the stator 25 to one direction, and a lockup clutch 28 including a damper mechanism. The fluid transmission apparatus 22 serves as a torque amplifier by the operation of the stator 25 when the difference in rotation speed between the pump impeller 23 and the turbine runner 24 is great and serves as a fluid coupling when the difference in rotation speed between the pump impeller 23 and the turbine runner 24 is small. The lockup clutch 28 can perform a lockup operation of connecting the pump impeller 23 (front cover 18) to the turbine runner 24 (turbine hub) and a lockup releasing operation. When a lockup ON condition is satisfied after the vehicle 10 starts, the pump impeller 23 and the turbine runner 24 are locked up by the lockup clutch 28 and the dynamic power from the engine 12 is mechanically and directly transmitted to the input shaft 31. At this time, the fluctuation of the torque transmitted to the input shaft 31 is absorbed by the damper mechanism.

Figures 3, 4:
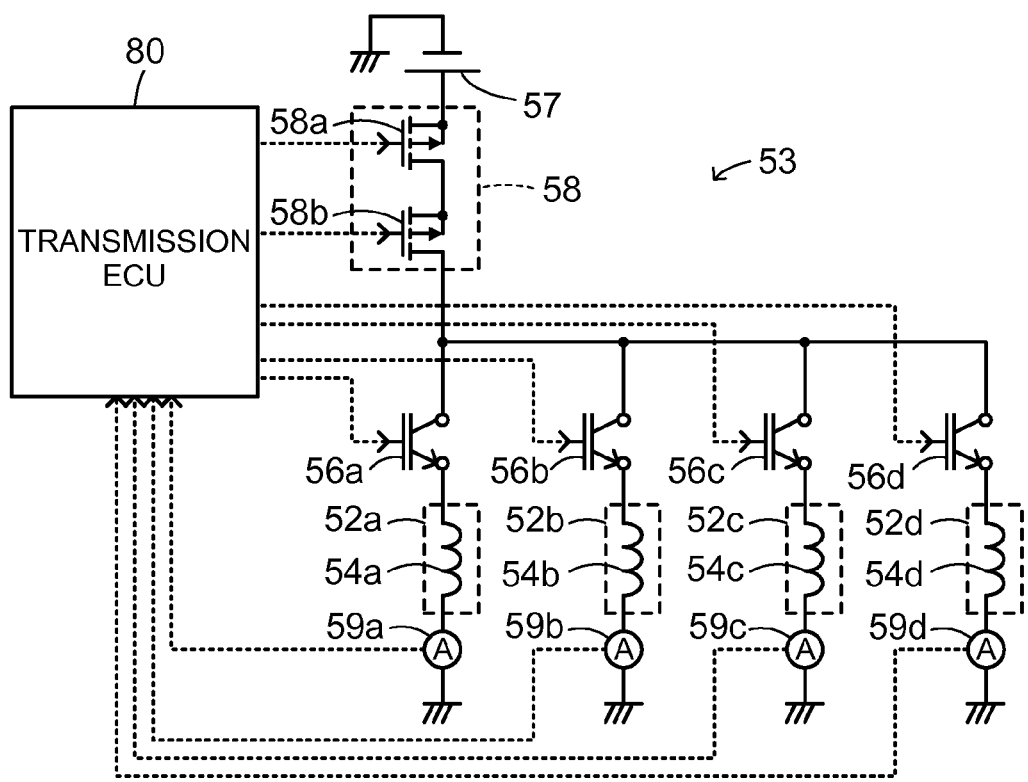
FIG. 3 is a diagram illustrating an operation table showing relationships between shift speeds of the automatic transmission 30 and operating states of clutches C-1 to C-3 or brakes B-1 and B-2.
FIG. 4 is a diagram schematically illustrating a configuration of an electrical system 53 including solenoids 54a to 54d as electromagnetic portions of linear solenoid valves 52a to 52d as electromagnetic valves.

The automatic transmission 30 is constructed as a stepped transmission with six speeds and includes a single-pinion planetary gear mechanism 35, a Ravigneaux planetary gear mechanism 40, three clutches C-1, C-2, and C-3, two brakes B-1 and B-2, and a one-way clutch F-1. The single-pinion planetary gear mechanism 35 includes a sun gear 36 as an externally-toothed gear, a ring gear 37 as an internally-toothed gear that is disposed concentrically with the sun gear 36, a plurality of pinion gears 38 that mesh with the sun gear 36 and the ring gear 37, and a carrier 39 that holds the plurality of pinion gears 38 so that the pinion gears 38 rotate and revolve. The sun gear 36 is fixed to a case and the ring gear 37 is connected to the input shaft 31. The Ravigneaux planetary gear mechanism 40 includes two sun gears 41a and 41b as externally-toothed gears, a ring gear 42 as an internally-toothed gear, a plurality of short pinion gears 43a that mesh with the sun gear 41a, a plurality of long pinion gears 43b that mesh with the sun gear 41b, the plurality of short pinion gears 43a, and the ring gear 42, and a carrier 44 that connects the plurality of short pinion gears 43a and the plurality of long pinion gears 43b and that holds the pinion gears so as to rotate and revolve. The sun gear 41a is connected to the carrier 39 of the single-pinion planetary gear mechanism 35 via the clutch C-1, the sun gear 41b is connected to the carrier 39 via the clutch C-3 and is connected to the case via the brake B-1, the ring gear 42 is connected to the output shaft 32, and the carrier 44 is connected to the input shaft 31 via the clutch C-2. The carrier 44 is connected to the case via the brake B-2 and is connected to the case via the one-way clutch F-1. FIG. 3 is a diagram illustrating an operation table showing relationships between shift speeds of the automatic transmission 30 and operating states of the clutches C-1 to C-3 or the brakes B-1 and B-2. As illustrated in the operation table of FIG. 3, the automatic transmission 30 can be switched to positions of first to sixth forward speeds , reverse speed, and a neutral position by combination of the ON and OFF states of the clutches C-1 to C-3 (where the ON state is an engaged state and the OFF state is a disengaged state) and the ON and OFF states of the brakes B-1 and B-2.

The fluid transmission apparatus 22 and the automatic transmission 30 are operated by a hydraulic circuit 50 that is drivingly controlled by the transmission ECU 80. The hydraulic circuit 50 includes an oil pump that feeds operating oil using the dynamic power from the engine 12, a primary regulator valve that regulates the operating oil from the oil pump to generate a line pressure PL, a secondary regulator valve that reduces the line pressure PL from the primary regulator valve to generate a secondary pressure Psec, a modulator valve that regulates the line pressure PL from the primary regulator valve to generate a constant modulator pressure Pmod, a manual valve that switches the destination (the clutches C-1 to C-3 or the brakes B-1 and B-2) of the line pressure PL from the primary regulator valve depending on the operation position of a shift lever 91, and a plurality of normally-closed linear solenoid valves 52a to 52d that regulate the line pressure PL from the manual valve to generate solenoid pressures to the corresponding clutches C-1 to C-3 or the corresponding brakes B-1 and B-2. In the embodiment, the brake B-2 is supplied with the operating oil from the solenoid valve 52c corresponding to the clutch C-3 at the time of engine braking at the first forward speed via a switching valve (not illustrated) and is supplied with the operating oil form the manual valve when the shift lever 91 is located at the reverse position (R position). That is, in the embodiment, the hydraulic circuit 50 does not have a linear solenoid valve dedicated to the brake B-2.

FIG. 4 is a diagram schematically illustrating a configuration of an electrical system 53 including solenoids 54a to 54d as electromagnetic portions of the linear solenoid valves 52a to 52d as electromagnetic valves. As illustrated in the drawing, the electrical system 53 includes transistors 56a to 56d serving as switching elements connected to the solenoids 54a to 54d, a DC power supply 57 of, for example, 12 V, a cutoff circuit 58 that connects the DC power supply 57 and the transistors 56a to 56d or cuts off the connection, and current sensors 59a to 59d that detect currents flowing in the solenoids 54a to 54d. Here, the cutoff circuit 58 has a configuration in which transistors 58a and 58b are connected in series to the DC power supply 57 and the transistors 56a to 56d. FIG. 4 illustrates an example where the transistors 56a to 56d are insulated gate bipolar transistors (IGBT) and the transistors 58a and 58b are metal-oxide semiconductor field-effect transistors (MOSFET), but the transistors may be of the same type. Hereinafter, for the purpose of convenience of explanation, the transistor 58a is referred to as a cutoff main transistor 58a, the transistor 58b is referred to as a cutoff sub transistor 58b, and the transistors 56a to 56d are referred to as driving transistors 56a to 56d.

In the electrical system 53, by adjusting the ON times (duty ratios) of the driving transistors 56a to 56d in a state where both the cutoff main transistor 58a and the cutoff sub transistor 58b are turned on, the currents flowing in the solenoids 54a to 54d can be adjusted and thus the solenoid pressures to the clutches C-1 to C-3 or the brakes B-1 and B-2 can be adjusted. When at least one of the cutoff main transistor 58a and the cutoff sub transistor 58b is turned off, the connections between the DC power supply 57 and the driving transistors 56a to 56d are cut off. Basically, the cutoff main transistor 58a and the cutoff sub transistor 58b are turned on when the ignition switch 90 is turned on, and the cutoff main transistor 58a and the cutoff sub transistor 58b are turned off when the ignition switch 90 is turned off. The cutoff sub transistor 58b may be maintained in the ON state regardless of the state of the ignition switch 90 when the cutoff main transistor 58a is normal.

The transmission ECU 80 is constructed as a microprocessor centered on a CPU and includes a ROM that stores a process program, a RAM that temporarily stores data, an input and output port, and a communication port in addition to the CPU. Signals from various sensors that detect the operating states of the engine 12 such as the engine speed Ne from the rotation speed sensor 14a mounted on the crank shaft 14, an input-shaft rotation speed Nin from a rotation speed sensor 31a mounted on the input shaft 31, an output-shaft rotation speed Nout from a rotation speed sensor 32a mounted on the output shaft 32, solenoid currents Ia to Id from the current sensors 59a to 59d that detect currents applied to the solenoid valves 52 to 58, the ignition signal from the ignition switch 90, a shift position SP from a shift position sensor 92 that detects the position of the shift lever 91, the accelerator operation amount Acc from the accelerator pedal position sensor 94, a brake pedal position BP from a brake pedal position sensor 96 that detects a depression amount on a brake pedal 95, the vehicle speed V from the vehicle speed sensor 98, and the like are input to the transmission ECU 80 via an input port. A control signal to the hydraulic circuit 50 and the like are output from the transmission ECU 80 via an output port.

The engine ECU 16, the brake ECU 17, and the transmission ECU 80 are interactively connected to each other via communication ports and interactively transmit and receive various control signals or data necessary for control.

Here, the driving transistors 56a to 56d, the cutoff circuit 58, and the current sensors 59a to 59d correspond to the electromagnetic valve driving circuit according to the embodiment. The transmission ECU 80 corresponds to the controller of the electromagnetic valve driving circuit according to the embodiment.

In the vehicle 10 according to the embodiment having the above-described configuration, the transmission ECU 80 drivingly controls the linear solenoid valves 52a to 52d of the hydraulic circuit 50 so as to form a shift speed of the automatic transmission 30. To drivingly control the linear solenoid valve 52a, first, a target current Ia* of the solenoid 54a is set on the basis of the accelerator operation amount Acc, the shift speed of the automatic transmission 30, the torque of the input shaft 31 of the automatic transmission 30, the temperature of the operating oil of the hydraulic circuit 50, and the like. Subsequently, a duty ratio (theoretically, the ratio of the ON time to the sum of the ON time and the OFF time of the driving transistor 56a) corresponding to the target current Ia* is set as a feedforward term Dffa, a feedback term Dfba is set by Expression (1) using the current Ia detected by the current sensor 59a and the target current Ia*, and the sum of the set feedforward term Dffa and the feedback term Dfba is set as a target duty ratio Da*. Then, the driving of the driving transistor 56a is controlled by outputting a switching command for switching the driving transistor 56a at the target duty ratio Da* to the driving transistor 56a. Here, Expression (1) is an expression for calculating the feedback term in a current feedback control for cancelling the difference between the current Ia and the target current Ia*. In Expression (1), "kp" of the first term on the right side is a gain of a proportional term and "ki" of the second term on the right side is a gain of an integral term. The linear solenoid valves 52b to 52d can be drivingly controlled similarly to the linear solenoid valve 52a. The currents Ia to Id detected by the current sensors 59a to 59d can be made to be equal to the target currents Ia* to Id* through the use of such driving control.

$$Dfba = kp(Ia^* - Ia) + ki\int(Ia^* - Ia)dt \quad (1)$$

Figure 5:
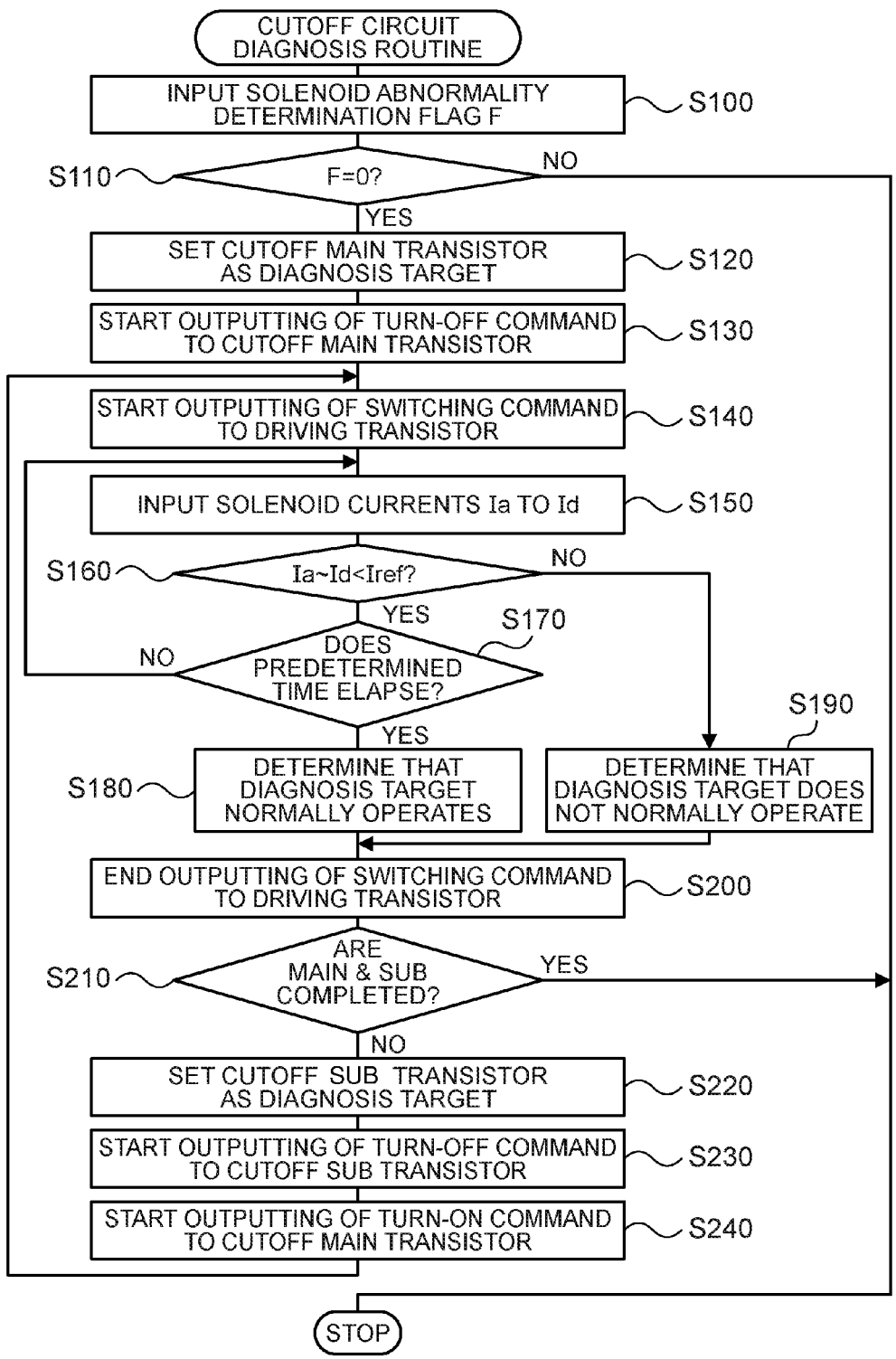
FIG. 5 is a flowchart illustrating an example of a cutoff circuit diagnosis routine which is performed by a transmission ECU 80 according to the embodiment.

The operation of the vehicle 10 according to the embodiment having the above-mentioned configuration, particularly, the operation when determining whether the cutoff circuit 58 normally operates (whether the connections between the DC power supply 57 and the driving transistors 56a to 56d can be normally cut off), will be described below. FIG. 5 is a flowchart illustrating an example of a cutoff circuit diagnosis routine which is performed by the transmission ECU 80 according to the embodiment. This routine is performed when the ignition switch 90 is turned off. When this routine starts its performance, both the cutoff main transistor 58a and the cutoff sub transistor 58b are turned on.

When the cutoff circuit diagnosis routine is performed, the transmission ECU 80 first inputs a value of a solenoid abnormality determination flag F indicating whether an abnormality occurs in at least one of the solenoids 54a to 54d (step S100) and checks the input value of the solenoid abnormality determination flag F (step S110). Here, the solenoid abnormality determination flag F is a flag which is set to 0 as an initial value and which is set to 1 when an abnormality occurs in at least one of the solenoids 54a to 54d through the solenoid abnormality determination routine (not illustrated). The case where an abnormality occurs in at least one of the solenoids 54a to 54d is, for example, a case where both the cutoff main transistor 58a and the cutoff sub transistor 58b are turned on and the solenoid currents Ia to Id detected by the current sensors 59a to 59d do not fluctuate from 0 or a maximum value for a predetermined period of time.

When the value of the solenoid abnormality determination flag F is 0, that is, when an abnormality does not occur in any of the solenoids 54a to 54d, the cutoff main transistor 58a is set as a diagnosis target (step S120) and a main turn-off process of outputting a main turn-off command for turning off the cutoff main transistor 58a to the cutoff main transistor 58a is started (step S130). By starting the main turn-off process, when the cutoff main transistor 58a or a signal line between the transmission ECU 80 and the cutoff main transistor 58a is normal, the cutoff main transistor 58a is turned off in response to a turn-off command and the connections between the DC power supply 57 and the driving transistors 56a to 56d are cut off. At this time, the cutoff sub transistor 58b is maintained in an ON state.

Subsequently, a diagnosis duty process of outputting a switching command for switching the driving transistors 56a to 56d at a predetermined duty ratio D1 to the driving transistors 56a to 56d is started (step S140). Here, the predetermined duty ratio D1 employs a value determined by experiments, analysis, or the like so that the solenoid pressure acting on the clutch or the brake corresponding to the solenoids 54a to 54d (linear solenoid valves 52a to 52d) out of the clutches C-1 to C-3 or the brakes B-1 and B-2 is less than the minimum oil pressure required for engagement of the clutch or the brake, that is, so that the current applied to the solenoids 54a to 54d is less than the minimum current Imin required for engagement of the clutch or the brake, when the connections between the DC power supply 57 and the driving transistors 56a to 56d are not cut off (the connections are maintained). As the predetermined duty ratio D1, duty ratios for causing a current of 80 mA, 100 mA, 120 mA, or the like to flow in the solenoids 54a to 54d can be used, for example, when the minimum current Imin is 280 mA, 300 mA, 320 mA, or the like. Also, as the predetermined duty ratio D1, different values may be used for the solenoids 54a to 54d (depending on specifications thereof), or the same value may be used therefor. The transmission ECU 80 outputs a switching command with the sum of the feedforward term and the feedback term as the target duty ratio when forming a shift speed of the automatic transmission 30 as described above. On the contrary, when performing the diagnosis duty process, the switching command with the predetermined duty ratio D1 as the target duty ratio is output. The use of the predetermined duty ratio D1 as the target duty ratio corresponds to the setting of the target duty ratio with the predetermined duty ratio D1 as the feedforward term without using the feedback term.

When the diagnosis duty process is started, that is, while performing the main turn-off process and the diagnosis duty process, the solenoid currents Ia to Id from the current sensors 59a to 59d are input (step S150), and the input solenoid currents Ia to Id are compared with a threshold value Iref (step S160). Here, the threshold value Iref is used to determine whether a current flows in the solenoids 54a to 54d and can employ a value (for example, 17 mA, 20 mA, or 23 mA) determined in consideration of the detection errors of the current sensors 59a to 59d or the temperature characteristics of resistance values Rsa to Rsd of the solenoids 54a to 54d. As the threshold value Iref, different values may be used for the corresponding solenoids 54a to 54d or the same value may be used therefor.

When all the solenoid currents Ia to Id are less than the threshold value Iref, it is determined that no current flows in any of the solenoids 54a to 54d and it is determined whether a predetermined time T1 elapses after the diagnosis duty process is started (step S170). When it is determined that the predetermined time T1 does not elapse, the routine returns to step S150. Here, the predetermined time T1 is a time required for confirming the determination of whether a current flows in any of the solenoids 54a to 54d and, for example, 40 msec, 50 msec, or 60 msec may be used.

When all the solenoid currents Ia to Id are less than the threshold value Iref until the predetermined time elapses, it is determined that the diagnosis target normally operates (the connections between the DC power supply 57 and the driving transistors 56a to 56d are cut off) (step S180), and the diagnosis duty process is ended (step S200). On the other hand, when at least one of the solenoid currents Ia to Id reaches the threshold value Iref or more before the predetermined time elapses, it is determined that the diagnosis target does not normally operate (the connections between the DC power supply 57 and the driving transistors 56a to 56d are not cut off) (step S190), and the diagnosis duty process is ended (step S200). In the embodiment, when it is determined that the diagnosis target does not normally operate, information (abnormality information) indicating the determination result is stored as a history in a nonvolatile storage medium (a flash memory or the like) and is notified to a driver by turning on a warning lamp (not illustrated) or outputting a warning sound from a speaker (not illustrated).

In this way, by starting the diagnosis duty process after starting the main turn-off process and comparing the solenoid currents Ia to Id with the threshold value Iref in the middle of the processes (while performing the main turn-off process and the diagnosis duty process), it is possible to determine (diagnose) whether the diagnosis target normally operates. The predetermined duty ratio D1 at which the currents applied to the solenoids 54a to 54d when the connections between the DC power supply 57 and the driving transistors 56a to 56d are not cut off (the connections are maintained) are less than the minimum current Imin required for engagement of the clutches C-1 to C-3 or the brakes B-1 and B-2 is used as the duty ratio (target duty ratio) of the switching command in the diagnosis duty process. Accordingly, even when the diagnosis target does not normally operate (the connections between the DC power supply 57 and the driving transistors 56a to 56d are not cut off), it is possible to suppress the engagement of the clutches or the brakes (the forming of a shift speed or the stopping of the rotation of the output shaft 32 of the automatic transmission 30). When performing the diagnosis duty process, the switching command is output with the predetermined duty ratio D1 as the target duty ratio (using the target duty ratio obtained with the predetermined duty ratio D1 as the feedforward term without using the feedback term). Accordingly, it is possible to prevent the duty ratio of the switching of the driving transistors 58a to 58d from fluctuating due to the influence of the oil pressure of the solenoid valves 52a to 52d (due to the fluctuation of back electromotive force (current) of the solenoids 54a to 54d based on the fluctuation in oil pressure of the solenoid valves 52a to 52d) and it is thus possible to prevent the erroneous determination (diagnosis) on whether the diagnosis target normally operates.

Then, it is determined whether both the cutoff main transistor 58a and the cutoff sub transistor 58b are completely diagnosed (step S210). When it is determined that the diagnosis of cutoff sub transistor 58b is not completed yet, the cutoff sub transistor 58b is set as the diagnosis target (step S220), a sub turn-off process of outputting a sub turn-off command for turning off the cutoff sub transistor 58b to the cutoff sub transistor 58b is started (step S230), a main turn-on process of outputting a main turn-on command for turning on the cutoff main transistor 58a to the cutoff main transistor 58a is started (step S240), and then the routine returns to step S140. The cutoff sub transistor 58b is set as the diagnosis target and it is determined (diagnosed) whether the diagnosis target normally operates (steps S140 to S200). When it is determined in step S210 that both the cutoff transistor 58a and the cutoff sub transistor 58b are completely diagnosed, the routine is ended.

When it is determined in step S100 that an abnormality occurs in at least one of the solenoids 54a to 54d, the cutoff main transistor 58a or the cutoff sub transistor 58b cannot be diagnosed and thus the routine is ended without any process. In this case, a fail-safe process not illustrated is performed.

In the above-mentioned transmission ECU 80 according to the embodiment, when the ignition switch 90 is turned off, the main turn-off command for turning off the cutoff main transistor 58a is output to the cutoff main transistor 58a, the switching command for switching the driving transistors 56a to 56d is output to the driving transistors 56a to 56d, and the solenoid currents Ia to Id detected by the current sensors 59a to 59d while outputting the main turn-off command and the switching command are compared with the threshold value Idref to determine (diagnose) whether the cutoff main transistor 58a normally operates (whether the connections between the DC power supply 57 and the driving transistors 56a to 56d are cut off). Similarly, it is determined whether the cutoff sub transistor 58b normally operates. Accordingly, it is possible to diagnose whether the cutoff main transistor 58a or the cutoff sub transistor 58b of the cutoff circuit 58 normally operates.

In the transmission ECU 80 according to the embodiment, the predetermined duty ratio D1 at which the currents applied to the solenoids 54a to 54d when the connections between the DC power supply 57 and the driving transistors 56a to 56d are not cut off (the connections are maintained) are less than the minimum current Imin required for engagement of the clutches C-1 to C-3 or the brakes B-1 and B-2 is used as the duty ratio of the switching command. Accordingly, even when the diagnosis target does not normally operate (the connections between the DC power supply 57 and the driving transistors 56a to 56d are not cut off), it is possible to suppress the engagement of the clutches or the brakes.

In the transmission ECU 80 according to the embodiment, as the diagnosis of the cutoff circuit 58, it is determined (diagnosed) whether each of the cutoff main transistor 58a and the cutoff sub transistor 58b normally operates, but it may be determined (diagnosed) whether only one of the cutoff main transistor 58a and the cutoff sub transistor 58b normally operates.

Figure 6:
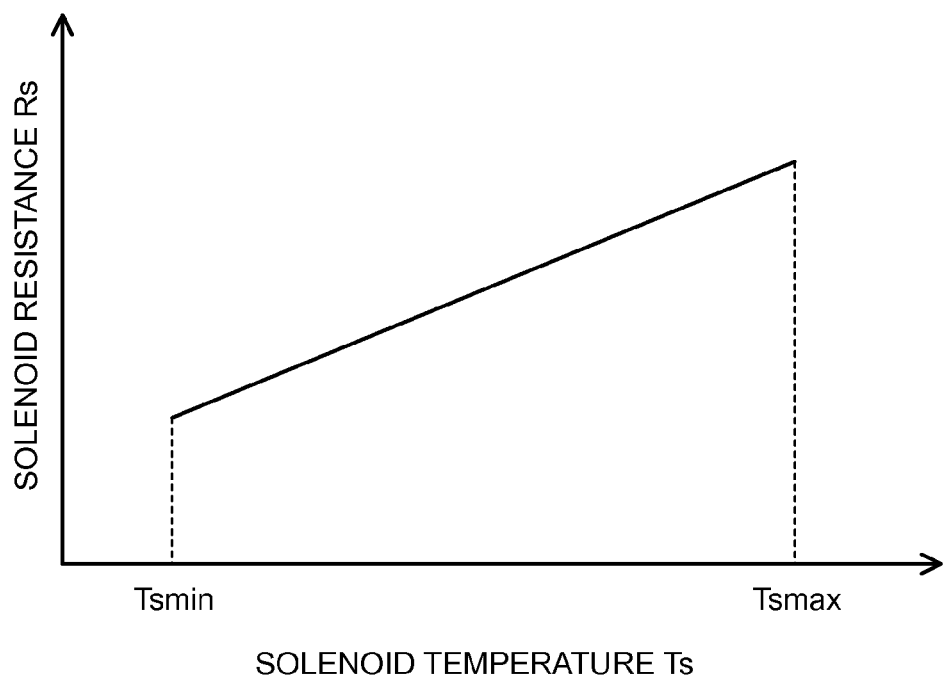
FIG. 6 is a diagram illustrating an example of a relationship between the temperature Ts and the resistance Rs of the solenoids 54a to 54d.

In the transmission ECU 80 according to the embodiment, the predetermined duty ratio D1 is set so that the currents applied to the solenoids 54a to 54d when the connections between the DC power supply 57 and the driving transistors 56a to 56d are not cut off (the connections are maintained) are less than the minimum current Imin, but more specifically, the predetermined duty ratio D1 is preferably set so that the currents applied to the solenoids 54a to 54d are less than the minimum current Imin at a temperature in a possible temperature range assumed in the solenoids 54a to 54d. FIG. 6 is a diagram illustrating an example of a relationship between the temperature Ts and the resistance Rs of the solenoids 54a to 54d. For the purpose of simplification, it is assumed in the drawing that the solenoids 54a to 54d exhibit the same temperature characteristic. In the drawing, "Tsmin" and "Tsmax" represent the minimum temperature (for example, −40° C. or −30° C.) and the maximum temperature (for example, 160° C. or 170° C.) assumed in the solenoids 54a to 54d. As illustrated in the drawing, the solenoids 54a to 54d have a tendency that the higher the temperature Ts becomes, the larger the resistance Rs becomes. The smaller the resistance Rs becomes, the larger current is likely to flow in the solenoids 54a to 54d. Accordingly, the predetermined duty ratio D1 is preferably determined so that the currents applied to the solenoids 54a to 54d are less than the minimum current Imin even when the temperature of the solenoids 54a to 54d is the minimum temperature Tsmin. In order to determine (detect) an abnormality when a cutoff target does not normally operate, the threshold value Iref is preferably set so that the determination is possible even when the temperature of the solenoids 54a to 54d is the maximum temperature Tsmax.

In the transmission ECU 80 according to the embodiment, the diagnosis duty process of outputting the switching command for switching the driving transistors 56a to 56d at the predetermined duty ratio D1 to the driving transistors 56a to 56d is started while performing the main turn-off process or the sub turn-off process, but the switching command may be output to some (for example, only the driving transistor 56a) of the driving transistors 56a to 56d.

In the transmission ECU 80 according to the embodiment, it is determined (diagnosed) whether the cutoff circuit 58 normally operates when the ignition switch 90 is turned off, but it may be determined (diagnosed) whether the cutoff circuit 58 normally operates when the operation position of the shift lever 91 is located at the parking position (P position) or the like. When the ignition switch 90 is turned off in the state where the shift lever 91 is located at the parking position or the like, it can be thought that the driving wheels 11a and 11b are locked by a parking lock mechanism not illustrated.

In the vehicle 10 including the transmission ECU 80 according to the embodiment, the cutoff circuit 58 of the electrical system 53 has the configuration in which the cutoff main transistor 58a and the cutoff sub transistor 58b are arranged in series with the DC power supply 57 and the driving transistors 56a to 56d, but may have a configuration including only one switch.

Figure 7:
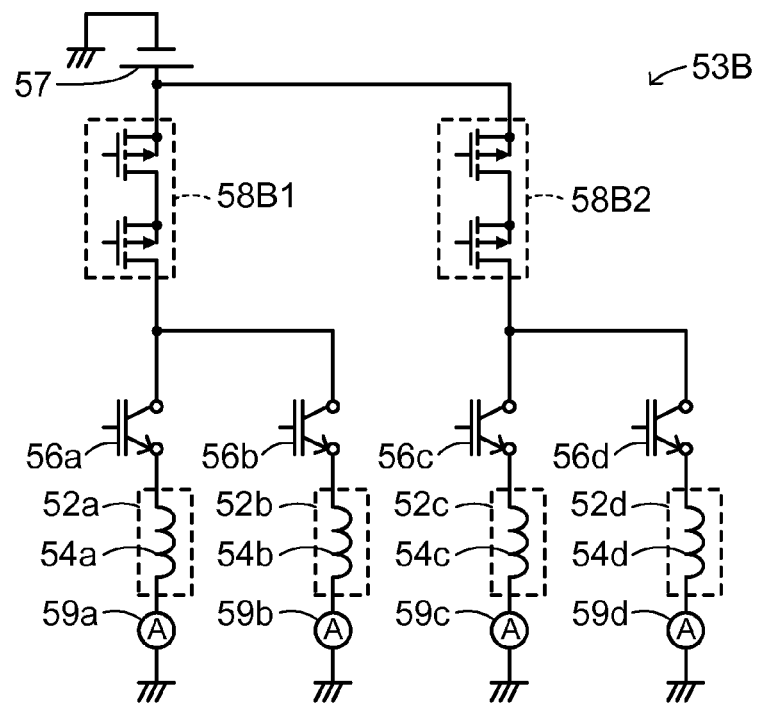
FIG. 7 is a diagram schematically illustrating a configuration of an electrical system 53B according to a modification example.
Figure 8:
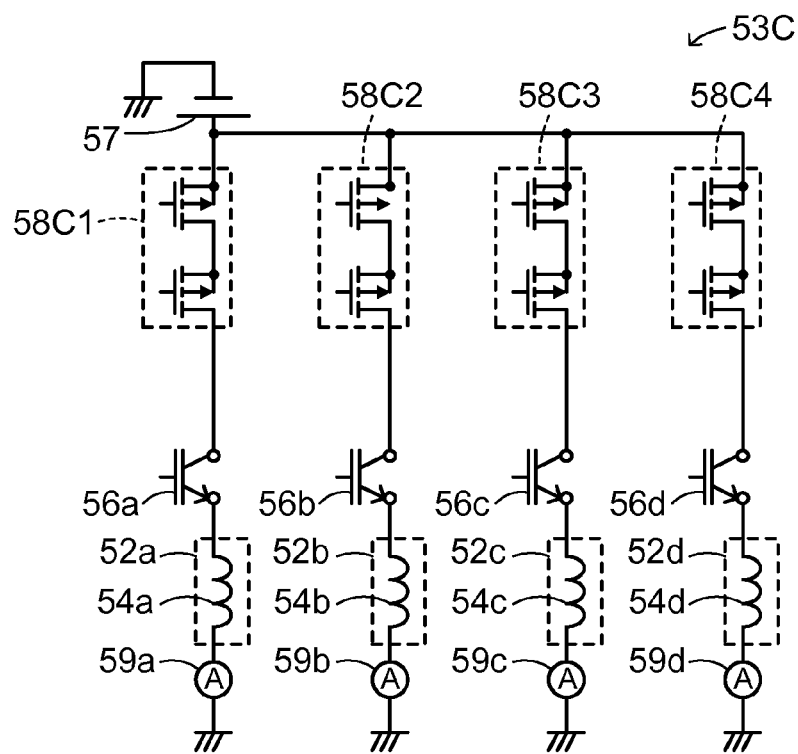
FIG. 8 is a diagram schematically illustrating a configuration of an electrical system 53C according to another modification example.

In the vehicle 10 including the transmission ECU 80 according to the embodiment, one cutoff circuit 58 is used for the DC power supply 57 and four driving transistors 56a to 56d (solenoids 54a to 54d), but a cutoff circuit 58B1 may be used for the DC power supply 57 and the driving transistors 56a and 56b and a cutoff circuit 58B2 may be used for the DC power supply 57 and the driving transistors 56c and 56d as exemplified in an electrical system 53B of FIG. 7, or cutoff circuits 58C1 to 58C4 may be used for the DC power supply 57 and the respective driving transistors 56a to 56d as exemplified in an electrical system 53C of FIG. 8. The number of driving transistors (solenoids) of the electrical systems 53 to 53C is not limited to four, but may be one, two, three, five, or more.

In the vehicle 10 including the transmission ECU 80 according to the embodiment, the automatic transmission 30 with six speeds is used, but an automatic transmission with three speeds, four speeds, or five speeds may be used or an automatic transmission with seven speeds or eight or more speeds may be used.

In the embodiment, the linear solenoid valves 52a to 52d as the electromagnetic valves are used for the hydraulic circuit 50 of the automatic transmission 30, but may be used for any device such as a continuously variable transmission or a transmission of a hybrid drive system.

In the embodiment, the present invention is embodied as a mode of the transmission ECU 80, but may be embodied as a mode of an abnormality diagnosing method of an electromagnetic valve driving circuit.

Correspondence between principal elements in the embodiment and principal elements of the invention described in the SUMMARY OF THE INVENTION will be described below. In the embodiment, the solenoids 54a to 54d correspond to the "solenoid", the driving transistors 56a to 56d correspond to the "switching element", the cutoff circuit 58 including the cutoff main transistor 58a and the cutoff sub transistor 58b corresponds to the "cutoff circuit", the current sensors 59a to 59d correspond to the "current detecting means", and the transmission ECU 80 performing the cutoff circuit diagnosis routine illustrated in FIG. 5 corresponds to the "determination means".

The correspondence between principal elements in the embodiment and principal elements of the invention described in the SUMMARY OF THE INVENTION is an example for causing the embodiment to specifically describe the mode for carrying out the invention described in the SUMMARY OF THE INVENTION and thus does not limit the elements of the invention described in the SUMMARY OF THE INVENTION. That is, the invention described in the SUMMARY OF THE INVENTION is interpreted on the basis of the description therein, and the embodiment is only a specific example of the invention described in the SUMMARY OF THE INVENTION.

While the modes for carrying out the present invention have been described with reference to the embodiment, the present invention is not limited to the embodiment but may be implemented in various modes within a range that does not depart from the gist of the present invention.

INDUSTRIAL APPLICABILITY

The present invention is applicable to industries of manufacturing a controller of an electromagnetic valve driving circuit, and the like.

The invention claimed is:

1. A controller of an electromagnetic valve driving circuit including a switching element connected to a solenoid of an electromagnetic valve, a cutoff circuit capable of cutting off a connection between a power supply and the switching element, and current sensor for detecting a solenoid current flowing in the solenoid, the controller comprising:

abnormality diagnosing means for outputting a cutoff command for cutting off the connection between the power supply and the switching element to the cutoff circuit and outputting a switching command for causing the switching element to perform a switching operation to the switching element when a predetermined diagnosis condition is satisfied, and determining that the cutoff circuit normally operates when the detected solenoid current is less than a threshold value and determining that the cutoff circuit does not normally operate when the detected solenoid current is greater than or equal to the threshold value while outputting the cutoff command and the switching command.

2. The controller of an electromagnetic valve driving circuit according to claim 1, wherein the electromagnetic valve is an electromagnetic valve that is used to supply an operating fluid to an engagement element of a transmission, and the switching command is a command for causing the switching element to perform a switching operation enabling a predetermined current to flow in the solenoid when the power supply and the switching element are connected to each other.

3. The controller of an electromagnetic valve driving circuit according to claim 2, wherein the predetermined current is a current smaller than a minimum current required for engagement of the engagement element.

4. The controller of an electromagnetic valve driving circuit according to claim 1, further comprising:

transmission control means for outputting the switching command for causing the switching element to perform the switching operation with a target duty ratio which is obtained using a feedforward term based on a target current to flow in the solenoid and a feedback term for cancelling a difference between the target current and the detected solenoid current when forming a shift speed of the transmission, wherein the abnormality diagnosing means is means for outputting the switching command for causing the switching element to perform the switching operation with a target duty ratio which is obtained using only the feedforward term without using the feedback term.

5. The controller of an electromagnetic valve driving circuit according to claim 1, wherein the abnormality diagnosing means does not determine whether the cutoff circuit normally operates when an abnormality occurs in the solenoid.

6. The controller of an electromagnetic valve driving circuit according to claim 1, wherein the cutoff circuit is a circuit capable of cutting off connections between the power supply and a plurality of the switching elements connected to the solenoids of a plurality of the electromagnetic valves, the current sensor includes multiple sensors for detecting a plurality of solenoid currents flowing in the plurality of solenoids, and the abnormality diagnosing means is means for outputting the switching command to the plurality of switching elements and determining whether the cutoff circuit normally operates using the plurality of detected solenoid currents.

7. The controller of an electromagnetic valve driving circuit according to claim 1, wherein the cutoff circuit is a circuit in which a plurality of cutoff portions capable of cutting off the connection between the power supply and the switching element are arranged in series, and the abnormality diagnosing means is means for determining whether each of the plurality of cutoff portions normally operates.

8. The controller of an electromagnetic valve driving circuit according to claim 1, wherein the predetermined diagnosis condition is a condition that is satisfied when an ignition switch of a vehicle is turned off.

9. An abnormality diagnosing method of an electromagnetic valve driving circuit including a switching element connected to a solenoid of an electromagnetic valve, a cutoff circuit capable of cutting off a connection between a power supply and the switching element, and current sensor for detecting a solenoid current flowing in the solenoid, the method comprising:

outputting a cutoff command for cutting off the connection between the power supply and the switching element to the cutoff circuit and outputting a switching command for causing the switching element to perform a switching operation to the switching element when a predetermined diagnosis condition is satisfied , and determining that the cutoff circuit normally operates when the detected solenoid current is less than a threshold value and determining that the cutoff circuit does not normally operate when the detected solenoid current is greater than or equal to the threshold value while outputting the cutoff command and the switching command.

\* \* \* \* \*